United States Patent [19]

Hoge

[11] Patent Number: 4,487,638
[45] Date of Patent: Dec. 11, 1984

[54] SEMICONDUCTOR DIE-ATTACH TECHNIQUE AND COMPOSITION THEREFOR

[75] Inventor: Carl E. Hoge, Encinitas, Calif.

[73] Assignee: Burroughs Corporation, Detroit, Mich.

[21] Appl. No.: 444,267

[22] Filed: Nov. 24, 1982

[51] Int. Cl.³ ............................................. B23K 35/34
[52] U.S. Cl. ......................................... 148/24; 148/23
[58] Field of Search ..................................... 148/23-26

[56] References Cited

U.S. PATENT DOCUMENTS 2,547,771  4/1951  Pessel .................................... 148/24

Primary Examiner—Peter D. Rosenberg
Attorney, Agent, or Firm—Charles J. Fassbender; J. Ronald Richbourg; Kevin R. Peterson

[57] ABSTRACT

A method of attaching semiconductor die to a package substrate and a composition for such die attach is disclosed, which method and composition comprise the combination of a low and a high-melting powder with a vehicle consisting of a solvent and a binder so as to form a thick-film ink. The ink is deposited onto the package substrate and the semiconductor die with a metallized back surface is located in contact with the deposited ink. The package containing the ink and the die is heated to a temperature of approximately 160° C. so as to remove the solvent from the powders and the residual binder. Next, the package is fired at a temperature within the range of approximately 200° C. to 430° C. so as to melt the low-melting powder which bonds the chip to the package substrate. Then, a lid is sealed over the die-receiving cavity of the package by heating the package and the bonded die to a temperature within a range of approximately 400° C. to 450° C. wherein the low-melting powder remelts and the high-melting powder partially dissolves into the liquid of the remelted low-melting powder.

13 Claims, 7 Drawing Figures

SEMICONDUCTOR DIE-ATTACH TECHNIQUE AND COMPOSITION THEREFOR

BACKGROUND OF THE INVENTION

1. Field of the Invention

This invention relates to a semiconductor die-attach technique and composition, and more particularly to a technique employing a composition suitable for remelting during subsequent assembly operations.

2. Description of the Prior Art

Semiconductor die are typically attached to a package by means of a bonding composition formed into plaques approximately the size of the die for ease of handling, which composition is typically made from various metals or polymers. A few examples of high-temperature melting die-attach compositions are gold-tin melting at approximately 280° C.; gold-silicon melting at approximately 363° C.; or gold-germanium melting at approximately 356° C. Such die-attach compositions have been adequate in the past for attaching relatively small die to packages. However, when the die is much larger in size, for example above 0.250 in$^2$ (VLSI size), such die-attach compositions have proven to be inadequate.

During a typical assembly operation, the die is placed in a cavity of a package containing the die-attach composition. Heat is applied to the package containing the die so as to melt the die-attach composition, which bonds the die to the package. Subsequently, a lid is placed over the die-receiving cavity of the package and heat is again applied so as to seal the lid to the package and form an hermetic enclosure for the integrated circuit. Such lid-sealing temperatures are typically 400° C. to 450° C.

When the prior art gold-tin die-attach composition is heated to such elevated temperatures, it remelts and dissolves gold and silicon into the melt. Gold-silicon and gold-germanium also remelt. They do not dissolve additional gold and silicon as readily, but instead form "brittle" or "hard" solder bonds which tend to crack VLSI size semiconductor die during cooling and temperature cycling.

Several types of die bond materials containing powders are presently available commercially. Epoxies are the most well known and have the longest history of use, (at least 10 years). They basically consist of an inorganic filler phase, either metal or ceramic, and an epoxy resin to bind the particles and to provide adhesion to the chip and substrate or package. Metallic fillers such as silver, gold and silver alloys are routinely combined with epoxy resins to produce electrically conductive composites for die bond applications. Insulating fillers such as magnesium oxide (MgO), aluminum oxide (Al$_2$O$_3$), beryllium oxide (BeO), and boron nitride (BN) are often employed where electrical insulation between the die and substrate is required.

Organic resins range from diglicydilether of bis-phenylA (low glass transition temperature) to cycloaliphatic epoxies (high glass transition temperature). Most come premixed and must be frozen prior to use to retard curing. Some, however, are two part systems. These consist of separate resin and hardener phases. Each is usually premixed with the desired filler phase. Just prior to use, the resin and hardener are mixed together and used for die bonding. Some of these systems cure at room temperature, others require temperatures as high as 180° C.

Metal filled epoxy systems normally have electrical resistivity values five to ten times higher than the pure metals and exhibit correspondingly poor thermal conductivity. Above 200° C. the epoxies degrade and if the temperature is increased further they give off volatile organic products.

Another class of organic die bonding materials is polyimides. These materials employ virtually the same metal systems as epoxies. Polyimides, however, possess much greater temperature stability. They cure between 250° C. and 350° C. and can withstand limited excursions to 400° C. They possess the same electrical and thermal conductivity limitations as epoxies. Additionally, both of these organic systems contain impurities such as sodium chloride which can enhance the chance of chip corrosion.

SUMMARY OF THE INVENTION

The method and composition of this invention overcome the disadvantages of the prior art die-attach methods and compositions described above by employing a composition formed of two separate metal powders, each having a different melting point.

In accordance with this invention, a method of attaching semiconductor die to a package substrate and a composition for such die-attach is provided which comprises combining a low and a high melting powder with a vehicle consisting of a solvent and a solute (binder) so as to form the die attach composition, also referred to herein as an ink. The ink is then deposited onto the package substrate, the semiconductor die having a metallized back surface is located in contact with the deposited ink, and the package containing the ink and the die are heated to a temperature of approximately 160° C. so as to remove the solvent from the powders, and the residual binder. The package containing the dried ink and the die is heated to a temperature within a range of approximately 200° C. to 430° C. so as to melt the low-melting powder which bonds the chip to the package substrate, and sealing a lid over the package by heating the package and the bonded die to a temperature within a range of approximately 400° C. to 450° C. wherein the low-melting powder remelts and the high-melting powder partially dissolves into the liquid of the remelted low-melting powder.

An advantage of this invention is a simple and economic method of attaching large (VLSI size) semiconductor die to package substrates. Also, the strain imparted to the die by the thermal mismatch between the package and the die can be controlled metallurgically by altering the material through proper selection of powders and their alloy compositions. The powder configuration of this material also accommodates package camber as the lower melting phase melts and collapses the structure during firing in H$_2$.

DETAILED DESCRIPTION OF A PREFERRED EMBODIMENT OF THE INVENTION

Figure 1:
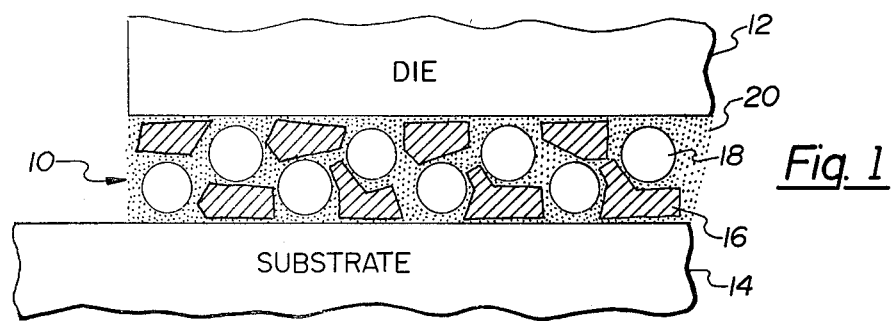
FIG. 1 is an enlarged cross-sectional graphic representation of the die-attach composition of this invention, such composition being disposed between a package substrate and a semiconductor die to be attached.

Referring now to FIG. 1, an ink 10 formed of a die-attach composition in accordance with this invention is disposed between a semiconductor die 12 and a package substrate 14 for attaching the die to the substrate. The die-attach ink is formed of a low temperature melting composition, particles 16 of which are graphically represented in the figures by cross-hatched polygons; a high temperature melting composition, particles 18 of which are represented graphically in the figures by circles; and, a vehicle (solvent and binder) 20 represented graphically in FIG. 1 by the dot-shading. The vehicle 20 binds the particles 16 and 18 of the low and high temperature melting compositions together and facilitates the deposition of the system onto the package.

The die-attach ink 10 is preferably formed of a metal powder melting at a temperature between approximately 173° C. and 350° C. combined as a composite with a higher temperature melting metal powder. The preferred properties of the higher temperature melting powder are that it must be wettable by the lower temperature melting powder; it must be soluble in the liquid phase of the lower temperature melting powder; and, it must either raise the melting or solidus temperature of the liquid phase as it dissolves or, reduce the ratio of liquid to solid. Also, it should melt at a sufficiently high temperature so as to prevent it from sintering to adjacent high-melting powders prior to the melting of the low-melting powder.

Several possible low-melting powder phases may be selected from the group consisting of: 1. lead-indium alloys having compositions within the range of approximately 33 atomic percent lead and 100 atomic percent lead; 2. lead-indium alloys described in 1. having up to 5 weight percent silver added thereto (the addition of more silver would increase the melting temperature); 3. lead-indium alloys described in 1. or 2. having up to 0.5 weight percent copper; 4. lead-indium alloys described in 1., 2., or 3. having up to 5 weight percent tin added; and, 5. gold-tin alloys having compositions between 16 and 25 weight percent tin. Minor quantities of elements (e.g., less than 1 percent by weight) such as antimony, arsenic, bismuth or gallium can be added to the low or high melting phases to increase their hardness, if desired. These powders are readily available at most chemical suppliers.

The solid or high-melting powder can be copper, silver or gold, or alloys thereof, with less than 2 percent by weight addition of palladium, nickel or platinum. Table I below lists several possible combinations of low and high-melting powders, wherein all proportions are given in weight percent and "low" and "high" refer to temperature.

TABLE I

| EXAMPLE | LOW-MELTING POWDER (approximate melting tempratures) | HIGH-MELTING POWDER (approximate melting temperatures) |
|---|---|---|
| I | 90 LEAD - 10 INDIUM (298° C. to 303° C.) | SILVER or COPPER (950.5° C.) (1083° C.) |
| II | 80 LEAD - 20 INDIUM (265° C. to 275° C.) | SILVER or COPPER |
| III | 50 LEAD - 50 INDIUM (190° C. to 215° C.) | SILVER or COPPER |
| IV | 92.5 LEAD - 5 INDIUM - 2.5 SILVER (304° C.) | SILVER or COPPER |
| V | 80 GOLD - 20 TIN (280° C.) | GOLD (1063° C.) |

For optimum performance, powders of each of the examples given above should have particle sizes no larger than 0.002 inches (50 microns). This size is specified by the final thickness of the die-attach. For thin die-attach interfaces, powders in the micron range can also be employed. Each of these Examples is combined in proportions of approximately 40 to 70 volume percent of the low-melting powder and approximately 60 to 30 volume percent of the high-melting powder.

In preparation, the low and high-melting powders are combined within the above-described ranges of ratios; and, a vehicle, consisting of a solvent and a binder, is added to the powders to form an ink composition. I have discovered a satisfactory vehicle for powders fired between approximately 350° C. and 430° C. to be a solution comprising approximately 98 to 99 weight percent terpineol solvent and approximately 2 to 1 weight percent ethyl cellulose binder.

The ink can be prepared at room temperature and may also be exposed to air during such preparation. Moreover, humidity is not a problem. The powders and vehicle can be combined most effectively in a rolling press so as to homogenize the constituents. Most conventional means for combining constituents are satisfactory.

A preferred vehicle must be selected so as to allow the powders to be uniformly deposited in the die-attach cavity. During the drying step (solvent removal step) the major quantity of the vehicle must be driven off (removed) without creating voids under the die. Some residual solute or binder must remain as a coating, and during the firing cycle the residual solute must be driven off without causing any particle-to-particle movement or rearrangement.

Other examples of suitable vehicles may be obtained by dissolving one or more kinds of nitrocellulose or acrylic resin binders in butylcarbitol-acetate, or terpineol solvents at a concentration of approximately 1 to 10 percent binder.

In a die-attach operation of this invention, a small volume of ink 10 (volume determined as a function of die size) is applied to the die-receiving cavity of the package 14. The die 12 is then placed into the cavity over the die-attach ink 10 and gently pressed down so as to secure the die in place by surface tension, as is partially shown in FIG. 1. The package 14 containing the die 12 is then placed in an oven at a temperature between approximately 60° C. and 80° C. for between approximately two and five hours, or the system is dried in a belt furnace having a 20-minute heat-cool cycle and reaching a maximum temperature between approximately 120° C. and 140° C. so as to dry the solvent from the vehicle. An air atmosphere, ($80N_2/20O_2$), is acceptable for this operation.

The drying operation should be performed without causing bubbles under the die 12. Fast drying precipitates ethyl cellulose at the outer perimeter of the die, which forms a barrier to further solvent removal. Hence, the drying heat should be increased ("ramped up") slowly to the desired temperature unless the lower, isothermal, drying sequence is used.

Alternatively, direct application of heat to the center of the die by means of an infrared light beam could speed up the drying operation by eliminating the temperature ramping up time. The light beam is first focused on the center of the die so as to dry the inner area of the die-attach composition, and then the light beam is moved outward from the center of the die so as to dry the remainder of the composition.

Figure 2:
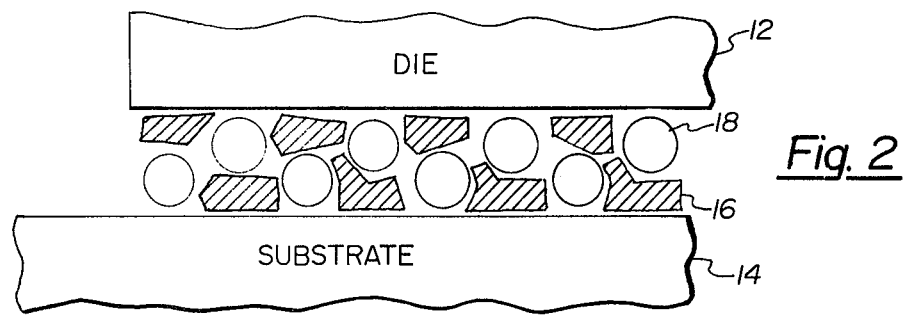
FIG. 2 is the cross-sectional view of FIG. 1 following the step of removing the solvent from the die-attach composition.
Figure 3:
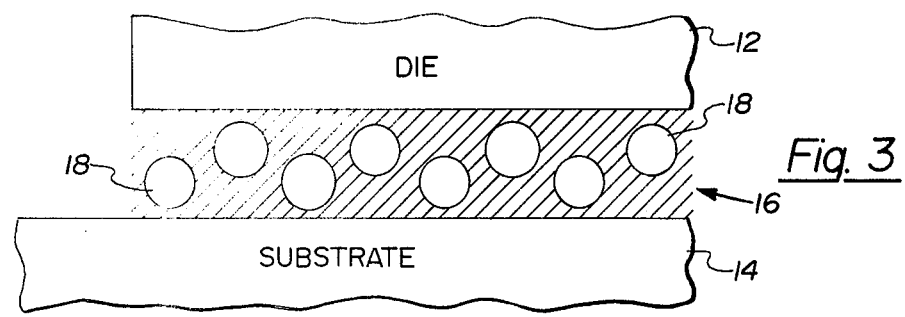
FIG. 3 is the cross-sectional view of FIG. 2 following the step of applying heat to the die-attach region.
Figure 4:
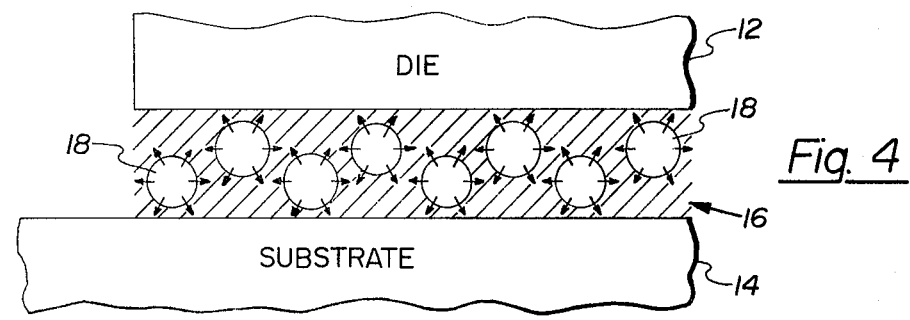
FIG. 4 is the cross-sectional view of FIG. 3 following the step of applying the package lid sealing heat.

The above-described drying operation removes the solvent but not the binder, and the particles 16 and 18 of the low and high-melting powders remain in place as depicted graphically in FIG. 2. The residual binder phase (not shown) remains as a thin coating on the powder surfaces. The binder phase promotes adhesion of the contacting powder particles.

Once the solvent is removed by the above-described drying operation, the structure as shown in FIG. 2 is fired in a furnace at a temperature within the range of 200° C. to 430° C., which is above the liquidus temperature of the lower-melting powder 16. This operation first removes the remaining binder and then bonds the die to the package by causing the lower melting powder to melt. The firing operation can be performed in a hydrogen ($H_2$) atmosphere (or any other reducing non-neutral atmosphere) on a belt furnace for Examples I, II, III, and IV.

Now that the die is bonded to the package substrate it can be wire bonded in the conventional manner. Subsequently, a lid is to be sealed over the die-receiving cavity of the package. More particularly, and by way of example, ceramic packages are often sealed using a ceramic lid having a screened-on glassy phase as a picture frame around the inner periphery of the lid. This configuration is bonded to the packages at temperatures between 400° C. and 450° C. so as to form hermetic enclosures for the semiconductor die. Such elevated temperatures will remelt the low-melting powder, and the high-melting powder 18 dissolves into the liquid of the low-melting powder.

Since the surface area of the high-melting powder can be controlled by altering this powder's particle size, the surface area can be designed to be much greater than the die or die-attach substrate area, so that the higher melting powder dissolves into the liquid to a much greater extent than the metallization on the die or package. Thus, the package and die metallization are spared at the expense of the high-melting powder 18. As dissolution occurs, the relative amount of liquid phase diminishes, further retarding dissolution of the metallization. On cooling, some of the dissolved material from the high-melting powder 18 reprecipitates on all the surfaces.

Figure 5:
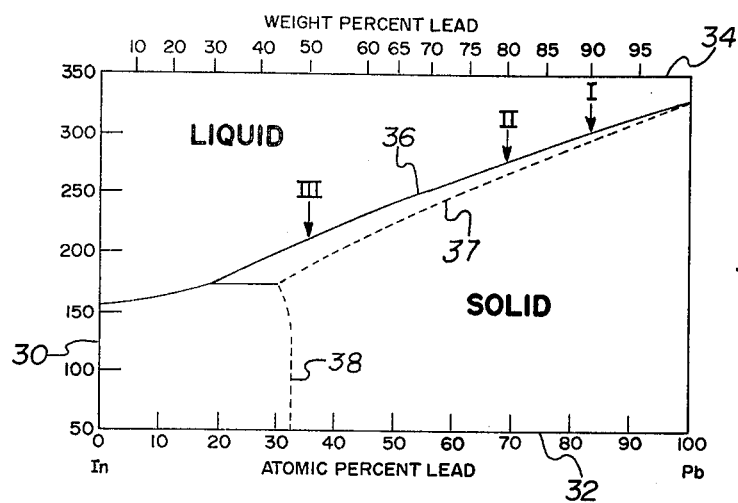
FIG. 5 is a phase diagram of lead and indium.

Referring now to FIG. 5, a phase diagram of indium-lead (In-Pb) alloys is shown. The vertical axis 30 represents temperature in degrees centigrade, the lower horizontal axis 32 represents atomic percent lead, and the upper horizontal axis 34 represents weight percent lead (wherein 100% In corresponds to 0% Pb on both the upper and lower horizontal axes). The area of the diagram above the curve 36 represents the liquid phase of the In-Pb alloys, and the area beneath this curve is either in a solid phase or a combined solid-liquid phase. The area between the curve 36 and the dashed line 37 represents the solid plus liquid phase. The area beneath the dashed line 37 and to the right of the dashed line 38 represents the solid lead phase, while the area beneath the curve 36 and to the left of the dashed line 38 represents other phases, such as solid indium and combinations of lead and indium.

The low-melting powder Examples I, II, and III given above are noted along the curve 36.

With reference to the FIG. 5 phase diagram, it may be seen that the Example I has a melting point of approximately 305° C.; the Example II has a melting point of approximately 275° C.; and, the Example III has a melting point of approximately 210° C. Thus, this alloy of In-Pb has melting points within the preferred temperature range of 173° C. to 350° C.

Figure 6:
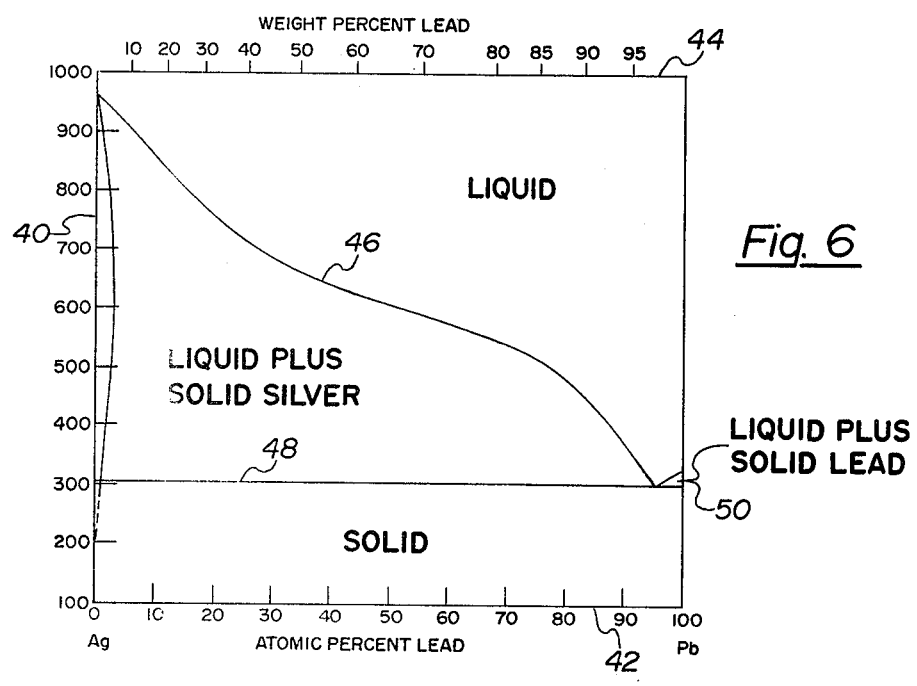
FIG. 6 is a phase diagram of silver and lead.

A phase diagram of silver-lead (Ag-Pb) is shown in FIG. 6, wherein the vertical axis 40 represents temperature in degrees centigrade. The lower horizontal axis 42 represents atomic percent lead and the upper horizontal axis 44 represents weight percent lead (wherein 100% Ag corresponds to 0% Pb on the upper and lower horizontal axes). The area of the diagram above curve 46 represents a liquid phase of the Ag-Pb alloy, and the area beneath this curve is divided into three parts. First, below 304° C. (as shown by line 48) the alloy is in a solid phase. Second, the large area between the line 48 and the curve 46 represents a liquid plus a solid silver phase and the much smaller area 50 between the same curve and line represents a liquid plus solid lead phase.

Silver and lead meet many of the requirements for a die-attach bonding powder. That is, these elements form the simple binary eutectic phase diagram shown in FIG. 6, and the melting point of silver (approximately 961° C.) is appreciably higher than that of lead (327° C.). Furthermore, these elements form no brittle intermediate compounds, and silver is soluble in the lead-rich melt.

The silver and lead composite can be designed by varying the surface area of silver powder plus minor alloy additions to lead and/or silver to accommodate an assembly operation wherein a silicon device is to be bonded to a gold metallized substrate. It should also be noted that this compound must subsequently withstand a maximum lid seal temperature of 450° C.

As an arbitrary starting point, a 50/50 solid-to-liquid atomic ratio is selected at the lid seal temperature. A die-bond material can be formulated by thoroughly mixing the appropriate powder constituents and subsequently blending them with a compatible organic vehicle, (terpineol-2 weight percent ethyl cellulose, for example) to form a thick film ink. Die placement, drying and firing (in a reducing atmosphere) would be performed as described herein above with reference to FIGS. 1 through 4.

Silver dissolution into the melt would, at equilibrium, produce a lead-rich liquid saturated with silver. Since gold and silver form a high temperature alloy, any dissolution of the gold from the die or substrate metallizations into the liquid phase would be retarded by the gold-silver alloy that formed. This process would essentially raise the chemical activity of gold in the silver saturated melt relative to that of gold in a pure lead melt which would help minimize dissolution. Hence, the silver-lead compound minimizes gold leaching into the liquid phase during firing.

To improve such properties of the die bond powder as leach resistance, wettability and fatigue life, second element additions such as indium, bismuth or antimony can be blended into the lead phase. Indium is a particularly versatile element since it can improve wettability, leach resistance and low temperature fatigue life. At this junction of the description, reference is again made to the In-Pb phase diagram of FIG. 5, wherein it can be seen that indium possesses a solubility of up to 66 atomic percent in the lead phase. This wide range of solubility produces liquidus points ranging from 200° C. (66 atomic percent In) to the melting point of lead (327° C.). Low temperature lead-indium powders find applications as bonding media for multi-die modules where die repair is an important factor; while powders rich in lead are employable in assembly operations requiring high temperature lid seals. Elements such as palladium, platinum or gold can be alloyed with the silver to also enhance its properties.

For any die attach or subsequent lid seal application requiring temperatures in excess of 363° C. (the gold-silicon eutectic temperature), special wafer processing steps are required. Specifically, a barrier metal system is needed between the silicon and gold metallization to prevent liquid formation and diffusion of silicon into the silver-lead melt. Silicon, if present in the solder, causes embrittlement and poor wetting.

Figure 7:
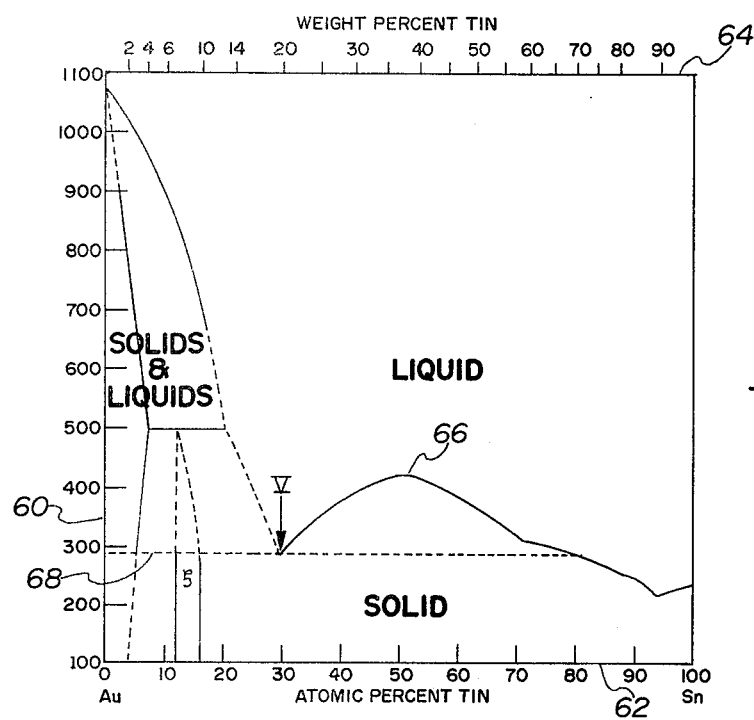
FIG. 7 is a phase diagram of gold and tin.

Referring now to FIG. 7, a phase diagram of gold-tin (Au-Sn) alloy is shown. The vertical axis 60 represents temperature in degrees centigrade, the lower horizontal axis 62 represents atomic percent tin (wherein 100% Au corresponds to 0% Sn), and the upper horizontal axis 64 represents weight percent tin (wherein 100% Au corresponds to 0% Sn). The area of the diagram above curve 66 represents the liquid phase of the Au-Sn alloy, and the area beneath this curve is divided into two separate phases by a dashed line 68. The area beneath the dashed line 68 represents the solid phase of the alloy, and the areas between this dashed line and the curve 66 represents a combined solids and liquid phase.

The gold-rich eutectic occurring at 20 weight percent tin (Example V) is typically employed as solder for lid sealing as well as die bond applications. The Example V eutectic melting at 280° C. includes the $\zeta$ and AuSn phases. Note that the $\zeta$ phase has a compositional, or solid solubility range, while AuSn exists as a stoichiometric compound. Typically, a phase possessing a range of solid solubility is much more ductile than one that does not. The solid 80/20 gold-tin eutectic is, therefore, composed of a brittle (AuSn) and a more ductile ($\zeta$) phase. Together they form a metallurgical structure possessing moderate hardness and low ductility.

It may be appreciated from the discussion hereinabove that an improved semiconductor die-attach technique and composition therefor has been described in detail. Thus, while the invention has been particularly shown and described with reference to one embodiment and a limited number of examples, it will be understood by those skilled in the art that the foregoing and other changes in form and details may be made without departing from the spirit and scope of the invention. Accordingly, it is intended that the present invention only be limited by the appended claims.

What is claimed is:

1. A semiconductor die-attach composition comprising:

a low-melting metal powder having a melting point within the range of approximately 173° C. to 350° C.;

a high-melting powder having a melting point within the range of approximately 900° C. to 1100° C. and being soluble in said low-melting powder;

a vehicle for blending said low-melting powder with said high-melting powder so as to form a thick-film ink;

said low-melting metal powder and said high-melting metal powder being combined in respective volume ratios of (40–70)% and (60–30)% to form a composition in which only a portion of said high-melting metal powder dissolves in and saturates the melt of said low-melting metal powder while the remainder of said high-melting metal powder stays in an undissolved solid state.

2. A composition as in claim 1 further characterized by said high-melting powder being selected from the group consisting of gold, copper, and silver and alloys of the same.

3. A composition as in claim 2 further characterized by said low-melting powder being formed of approximately 80 to 90 weight percent lead and approximately 20 to 10 weight percent indium.

4. A composition as in claim 2 further characterized by said low-melting powder being formed of approximately 92.5 weight percent lead, approximately 5 weight percent indium and approximately 2.5 weight percent silver.

5. A composition as in claim 2 further characterized by said low-melting powder being selected from the group consisting of lead, indium, silver, gold and tin.

6. A composition as in claim 2 further characterized by said low-melting powder being formed of approximately 80 weight percent gold and 20 weight percent tin.

7. A composition as in claim 2 further characterized by said vehicle being formed of approximately 98 to 99 weight percent terpineol solvent and approximately 2 to 1 weight percent ethyl cellulose binder.

8. A semiconductor die-attach composition for attaching semiconductor die to a package throughout a temperature range $T_1$ to $T_2$ where $T_2$ is substantially larger than $T_1$, comprising:

a first metal powder having a melting point below said temperture $T_1$;

a second metal powder having a melting point above said temperature $T_2$ and being soluble in a melted phase of said first metal;

a vehicle for blending said first metal powder with said second metal powder so as to form a thick-film ink;

said first metal powder and said second metal powder being combined in respective volume ratios of (40–70)% and (60–70)% to form a composition;

said composition having a partly solid and partly liquid phase that extends from below said temperature $T_1$ to above said temperature $T_2$ in which a portion of said second metal powder is dissolved in and saturates the liquid melt of all of said first metal while the remaining portion of said second metal remains in a powdered state.

9. A solder according to claim 8 wherein said second metal powder is selected from the group consisting of silver, copper, gold and alloys of the same.

10. A composition as in claim 9 further characterized by said low-melting powder being selected from the group consisting of lead, indium, silver, gold and tin.

11. A composition as in claim 9 further characterized by said low-melting powder being formed of approximately 80 to 90 weight percent lead and approximately 20 to 10 weight percent indium.

12. A composition as in claim 9 further characterized by said low-melting powder being formed of approximately 92.5 weight percent lead, approximately 5 weight percent indium and approximately 2.5 weight percent silver.

13. A composition as in claim 9 further characterized by said low-melting powder being formed of approximately 80 weight percent gold and 20 weight percent tin.

* * * * *